United States Patent [19]

Susuki et al.

[11] Patent Number: 4,826,565

[45] Date of Patent: May 2, 1989

[54] METHOD OF TREATING SURFACE OF MOLDED POLYACETAL RESIN PRODUCT

[75] Inventors: Yoshiharu Susuki; Tomoyuki Akeda, both of Fuji, Japan

[73] Assignee: Polyplastics Co., Ltd., Osaka, Japan

[21] Appl. No.: 81,429

[22] Filed: Aug. 4, 1987

[30] Foreign Application Priority Data

Aug. 6, 1986 [JP] Japan .................................. 61-184669

[51] Int. Cl.$^4$ ............................................ C09K 13/06
[52] U.S. Cl. ..................................... 156/668; 252/79.4
[58] Field of Search ....................... 156/668; 252/79.4; 427/307; 134/3

[56] References Cited

U.S. PATENT DOCUMENTS

| | | | |
|---|---|---|---|
| 3,235,426 | 2/1966 | Bruner | 156/668 |
| 3,554,880 | 1/1971 | Jenkin | 204/30 |
| 3,905,877 | 9/1975 | Deyrup | 204/30 |
| 3,963,590 | 6/1976 | Deyrup | 204/30 |
| 4,370,197 | 1/1983 | Abolafia et al. | 252/79.4 X |
| 4,464,435 | 8/1984 | Hattori et al. | 156/668 X |

*Primary Examiner*—David L. Lacey
*Assistant Examiner*—Thi Dang
*Attorney, Agent, or Firm*—Nixon & Vanderhye

[57] ABSTRACT

A molded article of polyacetal resin is surface-roughened by etching with an acidic solution which includes a compound selected from an amine, an amide, a thiourea, a quinoline, a thioether, a thiol and a derivative of acetylene.

6 Claims, No Drawings

METHOD OF TREATING SURFACE OF MOLDED POLYACETAL RESIN PRODUCT

The present invention relates to a method of treating a surface of a molded polyacetal resin product, in particular to a method of treating the surface of the molded polyacetal resin product for efficiently obtaining a molded polyacetal resin product which possesses surface characteristics suitable for surface decoration by means of printing, painting, vapor coating, plating and the like and which facilitates the adhesion to such treated surfaces of adhesive materials.

PRIOR ART STATEMENT

Since polyacetal resins are significantly chemically stable (e.g., since polyacetal resins lack surface activity, and since no suitable solvent exists which has an affinity for these reasons), it is difficult for them to be subjected to surface processing, such as surface decoration by means of plating, printing, painting, vapor coating and the like and by means of adhesives. Accordingly, polyacetal resins are usually not subjected to any such surface processing. Recently however, the mechanical, physical and chemical properties and functions for polyacetal resins have advanced, in addition to other special properties for polyacetal resins, such as its decorative properties and adhesive properties due to the diversified end uses in which polyacetal resins have been employed. For example, when polyacetal resins are employed as an exterior part, a metallic surface property is required for the polyacetal resins in many cases.

Methods of treating the surface of a molded polyacetal resin product with phosphoric acid, p-toluence sulfonic acid, sulfuric acid and the like for improving the molded polyacetal resin product's surface-processability, for example, its surface-coating property upon plating, have been disclosed in U.S. Pat. Nos. 3,235,426; 3,554,880; 3,905,877; and 3,963,590. However, these methods are from a practical viewpoint difficult to provide a molded polyacetal resin product having the desired surface-processability.

On the other hand, methods of roughing the surface of the molded polyacetal resin produce by adding substances, such as metal carbonates, which can be easily dissolved out with acids, and dissolving out the metal salts with acids after molding have been disclosed in Japanese Patent Laid-Open No. Sho 55-78023, Japanese Patent Laid-Open No. Sho 55-92741 and Japanese Patent Laid-Open No. Sho 56-152845. These methods have lead to the practical provision of a molded polyacetal resin product having a desired surface-processability. These methods, however, have exhibited problems. For example, advanced process control is required in order to effectively control the range of etching conditions for obtaining a molded product having superior surface characteristics. In addition, and the capacity of the etching solution is reduced over a period of time during use and becomes contaminated with metallic ions generated from the corrosion of the etching vessel or jigs. This in turn, reduces the surface-processability, for example, the adhesion capability of a plated layer, for the molded polyacetal resin product. Accordingly, solutions to these problems in the practical use of these methods in the industrial field has been needed.

SUMMARY OF THE INVENTION

The present invention is directed towards a solution to the above-identified problems and thus provides a method which is capable of roughening the surface of a molded polyacetal resin product so as to give the product a superior surface-processability. According to this invention, an acidic solution which comprises specified compounds (to be described later) added thereto is employed as the etching solution.

The invention provides a method of treating a molded article of polyacetal resin so as to roughen its surface, and includes etching the surface with an acidic solution comprising an additive compound selected from an amine, an amide, a thiourea, a quinoline, a thioether, a thiol and a derivative of acetylene and an acid. The above definition about the additive compound is classified into (a) a nitrogen-containing organic material (such as an amine, an amide, a thiourea and a quinoline), (b) a sulphur-containing organic material (such as a thiourea, a thioether and a thiol) and (c) an unsaturated organic material (such as an acetylene derivative).

In the invention, the acid may be used in a conventional amount.

Thus, the present invention relates to a method of treating a surface of the molded polyacetal resin product, whereby the etching is carried out using an acidic solution comprising at least one additive compound selected from the group consisting of amines, amides, thioureas, quinolines, thioethers, thiols and acetylene. According to the present invention, not only is the range of the etching conditions increased for obtaining a molded product having superior surface characteristics (thereby simplifying the process control) but also the capacity of etching solution to etch the polyacetal resin is not significantly reduced over time. Therefore, the invention is capable of reliably obtaining a molded polyacetal resin product having superior surface-processability.

In the present invention, sulfuric acid, hydrochloric acid and phosphoric acid are preferably used singly alone or in combination as the principal acidic substances of the acidic solution (etching solution).

In addition, other acidic substances, such as acetic acid and p-toluene sulfonic acid, or oxidizing substances, such as chromic acid and chromates, may be added to the principal acidic substances mentioned above.

The present invention is characterized in the addition of the following specified substances to the etching solution comprising the above described acidic substances. Thus, the above described objects can be achieved and various effects and advantages can be obtained. That is to say, the specified substances to be added to the acidic etching solution according to the present invention include amines such as dimethylamine, trimethylamine, ethylamine, diethylamine, triethylamine, dibutylamine, propylamine, hexamethylenetetramine, xylidine, toluidine and N-butyldiethanol amine; amides such as acetamide and dimethylformamide; thioureas such as thiourea, diethyl thiourea and dibutyl thiourea; quinolines such as quinoline, naphthoquinoline and phenylquinoline; thioethers such as propyl sulfide; thiols such as hexane thiol and mercaptbenzothioazol; and acetylenes such as propalgyl alcohol, butyn diol and hexynol. At least one of these compounds is added at a ratio of 0.2 to 100 g based on one liter of the etching solution. The increase of the range of etching conditions and the stabilized etching process for prolonged periods of time cannot be achieved when such compounds are added at a ratio less than 0.2 g based on one liter of the etching solution. On the other hand, the etching process is hindered, whereby the surface-processability deteriorates when such compounds are added at a ratio larger than 100 g based on one liter of the etching solution. The compounds are preferably added at a ratio of 1 to 20 grams per liter of etching solution.

In addition, in order to prevent bubbles from adhering to the surface of the molded product during the etching process, surface active agents and the like may be added to the etching solution prepared in the above described manner.

Any suitable polyacetal resin may be used in the practice of the present invention. Polyacetal homopolymers, polyacetal copolymers, whose main chain mainly comprises oxymethylene chain, and polyacetal resins modified by cross-linking or graft-copolymerizing using known methods can successfully be used as the polyacetal resins in the practice of the present invention. However, in order to more efficiently roughen the surface of these polyacetal resins and obtain polyacetal resins having superior surface-processability, compounds selected from a group consisting of carbonates, phosphates, sulfates, acetates, silicates, hydroxides and oxides of the Group II metals of the Periodic Table of Elements, preferably calcium carbonate, are added to the polyacetal resins.

In view of physical properties of the polyacetal resins and the processability in plating and the like after the surface has been roughened, it is preferred that these compounds have a mean particle diameter of 0.01 to 20μ, preferably 0.1 to 10μ, and added at a ratio of 0.1 to 30%, preferably 0.5 to 10%, by weight based on the whole composite.

In addition, it is preferred that the polyacetal resin composite used in the present invention further comprises the known additives such as antioxidants and heat stabilizers.

Other known substances which are typically used as additives in general thermoplastic resins and thermosetting resins can optionally be added to the polyacetal resins used in the present invention. These additives are present in dependence upon the end use of the polyacetal resins, the amount of surface roughening achieved by etching, the surface-processability after the etching process, and the physical properties after the etching process.

Such known substances include organic high molecular substances, for example various kinds of stabilizers for improving lightproofness, weatherproofness and the like, lubricants, mold-release agents, plasticizers, nucleating agents, antistatic agents, surface active agents and the like; olefinic homo- or copolymers such as polyurethane resins, fluorine resin, polyethylene, polypropylene, ethylene-propylene copolymer, ethylene-vinyl acetate copolymer and ethylene-alkyl acrylate copolymer; vinylic compounds and copolymers thereof such as styrene-butadiene-acrylonitril copolymer and styrene-acrylonitril copolymer; polymers such as graft copolymers comprising polyacrylic resins, polyamide resins and thermoplastic segment type copolyesters; or modified substances starting therefrom; and fibrous, plate-like, granular and powdery inorganic compounds, such as glass fiber, metallic fiber, boron fiber, potassium titanate, ceramic, glass flake, glass bead, mica, talc, high dispersive silicate, alumina, aluminium hydroxide, silica sand, quartz sand, wollastonite, various kinds of metallic powder, metallic foil, silicon carbide, boron nitride and silicon nitride; whiskers; metallic whiskers and the like in addition to said antioxidants and the like.

In the etching process of the molded product formed of such polyacetal resin composites with the acidic solution containing the above described specified compounds, the optimum treatment conditions of the molded product in the etching solution are selected in dependence upon the properties of the etching solution. Generally, the preferred conditions are temperatures of 10° to 80° C. and treating times of 5 to 30 minutes. The treating conditions are selected from these ranges in many cases.

Other known methods for treating a molded polyacetal resin product may be practiced in combination with the method of this invention either before or after (or both before and after) the etching process of this invention. For example, the molded product can be heated, treated with hot water or immersed in a solution containing specified compounds before or after the etching process. Such treatments after the etching process can be used as a means to neutralize the etching solution, or as a means to and/or dry the resulting molded polyacetal resin product.

The present invention will be described in greater detail below with reference to the preferred embodiments thereof and the comparative example. However, the present invention is not limited to these examples.

PREFERRED EMBODIMENTS 1 TO 4 AND THE COMPARATIVE EXAMPLE 1

A flat plate (50 mm×70 mm×3 mm) was molded from polyacetal resin containing calcium carbonate at a ratio of 3% by weight by means of the injection molding and adopted as a test piece.

The test piece was subjected to annealing at 145° C. for one hour and then degresed at 60° C. for 5 minutes by the use of ACE CLEAN A 220 (manufactured by Okuno Pharmaceutical Industries Co., Ltd.), and subsequently, subjected to the etching process. The acidic solutions comprising 98%-sulfuric acid, 85%-phosphoric acid and water at a ratio of 40/25/35 (by weight) with thiourea added at various concentrations as shown in Table-1 were used in the surface treatment. The surface treatment was conducted under the conditions as shown in Table-1. Subsequently, the etched test piece was subjected to the plating process by the following method. First, the etched test piece was neutralized with a 5 weight %-sodium hydroxide aqueous solution, washed, dried, immersed in a pretreatment solution for use in plating (CATALYST manufactured by Okuno Pharmaceutical Industries Co., Ltd.) at normal temperature for 3 minutes, immersed in an accelerator comprising 5 weight %-hydrochloric acid aqeous solution at 35° C. for 5 minutes, washed and immersed in a chemical nickel plating solution (MTP chemical nickel plating solution manufactured by Okuno Pharmaceutical Industries Co., Ltd.) at 40° C. for 12 minutes to chemically plate nickel.

The chemically plated test piece was further subjected to an electric plating, thermally treated at 80° C. for one hour, stabilizing the adhesion and then the adhesion of the plated layer and the external appearance were evaluated. The former was evaluated by the conventional peel test at 10 mm width while the latter was visually judged on the basis of the attenuation of the reflected image under a light source of 300 luxes or more. On the other hand, for comparison, the similar test was conducted on a test piece obtained without adding thiourea to the etching solution. The evaluation results are shown in Table-1 together. In addition, the results as shown in Table-1 were considered from other angles with the results as shown in Table-2 and Table-3. That is to say, Table-2 shows a range of etching time capable of achieving an adhesion of 1.0 kg/cm or more and a mirror-finished surface when plated and Table-3 shows the maximum adhesion which can be reached with maintaining a mirror-finished surface when plated. Both Table-2 and Table-3 show that the effect of the addition of thiourea is significant.

TABLE 1

| | Etching solution | | |
|---|---|---|---|
| | Base | Quantity of thiourea added (g/l) | Evaluation item |
| Examples | | | |
| 1 | 98% - sulfuric acid/ 85% - phosphoric acid/ water = 40/25/35 (by weight) | 1 | External appearance[*2] Adhesion (kg/cm) |
| 2 | 98% - sulfuric acid/ 85% - phosphoric acid/ water = 40/25/35 (by weight) | 5 | External appearance[*2] Adhesion (kg/cm) |
| 3 | 98% - sulfuric acid/ 85% - phosphoric acid/ water = 40/25/35 (by weight) | 10 | External appearance[*2] Adhesion (kg/cm) |
| 4 | 98% - sulfuric acid/ 85% - phosphoric acid/ water = 40/25/35 (by weight) | 20 | External appearance[*2] Adhesion (kg/cm) |
| Comparative example | | | |
| 1 | 98% - Sulfuric acid/ 85% - phosphoric acid/ water = 40/25/35 (by weight) | — | External appearance[*2] Adhesion (kg/cm) |

| | Etching time (min)[*1] at 40° C. | | | | | | | | |
|---|---|---|---|---|---|---|---|---|---|
| | 8 | 9 | 10 | 11 | 12 | 13 | 14 | 15 | 16 |
| Examples | | | | | | | | | |
| 1 | O 0.8 | O 1.0 | | | O 2.1 | O 2.6 | Δ 3.5 | Δ 4.0 | |
| 2 | O 0.8 | O 1.0 | | | O 2.0 | | | O 3.6 | Δ 3.9 |
| 3 | | O 0.8 | O 1.0 | | O 1.6 | | | O 2.9 | O 3.4 |
| 4 | | | O 0.5 | | O 0.9 | O 1.9 | | O 1.7 | |
| Comparative example | | | | | | | | | |
| 1 | O 0.7 | O 1.0 | | | O 2.3 | Δ 2.8 | | Δ 3.3 | |

| | Etching time (min)[*1] at 40° C. | | | | | | | | |
|---|---|---|---|---|---|---|---|---|---|
| | 17 | 18 | 19 | 20 | 21 | 22 | 23 | 24 | 25 |
| Examples | | | | | | | | | |
| 1 | | | | | | | | | |
| 2 | | | | Δ 4 | | | | | |
| 3 | O 3.8 | Δ 4 | | Δ 4 | | | | | |
| 4 | | | | | O 2.5 | O 2.8 | O 3.0 | O 3.2 | Δ 3.4 |
| Comparative example | | | | | | | | | |
| 1 | | | | | | | | | |

TABLE 1-continued

| ative example |
|---|
| 1 |

[*1]Standard etching times are 9, 12, 15, 20 and 25 minutes. However, in order to search for the limit treating time for achieving a mirror-finished surface when plated with maintaining an adhesion of 1.0 kg/cm or more when plated, the treatment was conducted also at times other than the above described times.
[*2] O: Mirror-finished surface Δ: Mirror-finished surface to an extent that an image slightly grows dim.

TABLE 2

| | Quantity of thiourea added (g/l) | Practical etching time[*1] | |
|---|---|---|---|
| | | Time (min) | Width (min) |
| Examples | | | |
| 1 | 1 | 9~13 | 4 |
| 2 | 5 | 9~15 | 6 |
| 3 | 10 | 10~17 | 7 |
| 4 | 20 | 12~23 | 11 |
| Comparative example | | | |
| 1 | — | 9~12 | 3 |

[*1]Etching time capable of achieving an adhesion of 1.0 kg/cm or more and a mirror-finished surface when plated.

TABLE 3

| | Quantity of thiourea added (g/l) | Practical etching time[*1] |
|---|---|---|
| Examples | | |
| 1 | 1 | 2.6 |
| 2 | 5 | 3.6 |
| 3 | 10 | 3.8 |
| 4 | 20 | 3.2 |
| Comparative example | | |
| 1 | — | 2.3 |

[*1]Maximum adhesion which can be reached with maintaining a mirror-finished surface when plated.

EXAMPLES 5 TO 13 AND COMPARATIVE EXAMPLE 2

In these examples the effect of the addition of the specified compounds to the etching solution in the control of the deterioration after the use for a long time and the reduction in capacity of the etching solution was investigated.

The same test piece as in the above described examples 1 to 4 and Comparative Example 1 was used. The etching solution was prepared by adding the specified compounds as shown in Table-4 to an acidic solution comprising 98%-sulfuric acid, 36%-hydrochloric acid and water at a ratio of 47/13/40 (by weight). After the preparation of the etching solution, the test piece was etched in the etching solution, in which the appointed treatment (etching at a rate of 10 dm²/liter/day) has been continued for the appointed period, and plated and then an adhesion when plated was measured.

In addition, for comparison, the similar test was conducted on a test piece obtained without adding these specified compounds to the etching solution. The procedures other than the etching process were conducted in the same manner as in the above described Examples 1 to 4 and Comparative Example 1. The results are shown in Table-4.

TABLE 4

| | Additive*1 | Adhesion when plated (kg/cm) | | | | |
|---|---|---|---|---|---|---|
| | | Immediately after the preparation of the etching solution | After three days*2 | After five days*2 | After ten days*2 | After fourteen days*2 |
| Example | | | | | | |
| 5 | Thiourea | 3.0 | 2.7 | 2.6 | 2.3 | 2.1 |
| 6 | Diethyl thiourea | 3.1 | 2.8 | 2.6 | 2.4 | 2.1 |
| 7 | Trimethylamine hydrochloride | 3.0 | 2.6 | 2.5 | 2.1 | 2.0 |
| 8 | N—butyl-diethanolamine | 2.8 | 2.5 | 2.4 | 2.0 | 1.8 |
| 9 | Acetamide | 2.9 | 2.6 | 2.3 | 1.8 | 1.7 |
| 10 | 2-mercaptbenzothiazol | 2.8 | 2.6 | 2.4 | 2.1 | 1.7 |
| 11 | Proplgyl alcohol | 2.7 | 2.5 | 2.1 | 1.8 | 1.6 |
| 12 | 2-phenyl-quinoline | 2.9 | 2.7 | 2.4 | 2.0 | 1.8 |
| 13 | Propyl sulfide | 3.0 | 2.6 | 2.4 | 1.9 | 1.7 |
| Comparative Example 2 | — | 3.0 | 2.8 | 2.1 | 1.3 | 1.0 |

*1Added at a ratio of 5 g/liter (etching solution).
*2Number of days after the preparation of the etching solution (meaning that the etching solution was used in the surface treatment after three days, five days, ten days and fourteen days from the preparation thereof) The etching process was conducted at 25° C. for 10 minutes. In every case a mirror-finished surface was obtained after plating.

As is obvious from the above described description and Examples, the range of the effective etching conditions can be extended by etching the molded polyacetal resin product in the acidic solution comprising the specified compounds such as amines, amides, thioureas, quinolines, thioethers, thiols and acetylene. And, the harmful influences due to the change of the etching solution over time can be suppressed. Moreover the surface of the molded polyacetal resin product can be stably and easily roughened and provided with a superior surface-processability.

What is claimed is:

1. A method of treating a molded article of a polyacetal so as to roughen a surface thereof, which comprises the step of etching a surface of the molded polyacetal article with an acidic solution comprising an acid and a compound selected from the group consisting of an amine, an amide, a thiourea, a quinoline, a thioether, a thiol, and a derivative of acetylene.

2. A method as claimed in claim 1, in which said solution contains 0.2 to 100 grams of the compound per liter of the solution.

3. A method as claimed in claim 1, in which said acid is selected from the group consisting of sulfuric acid, hydrochloric acid and phosphoric acid.

4. A method as claimed in claim 1, in which the solution further comprises at least one other substance selected from the group consisting of an acidic substance other than said acid, and an oxidizing substance.

5. A method as claimed in claim 1, in which the polyacetal comprises a carbonate, a phosphate, a sulfate, an acetate, a silicate, a hydroxide or an oxide of a metal belonging to group II of the periodic table of elements.

6. A method of surface-roughening a molded article which consists essentially of a polyacetal resin comprising contacting a surface of the molded article with an etchant solution which includes an acid, and between 0.2 to 100 grams per liter of the etchant solution of at least one additive compound selected from the group consisting of amines, amides, thioureas, quinolines, thioethers, thiols, and derivatives of acetylene, and maintining the etchant solution in contact with the surface of the molded article for a time sufficient to etch the polyacetal resin on said article surface, whereby surface-roughening of the molded article is achieved.

* * * * *

UNITED STATES PATENT AND TRADEMARK OFFICE
CERTIFICATE OF CORRECTION

PATENT NO. : 4,826,565

DATED : May 2, 1989

INVENTOR(S) : Susuki et al

It is certified that error appears in the above-identified patent and that said Letters Patent is hereby corrected as shown below:

Column 1, line 36, after "acid," delete "p-toluence" and insert --p-toluene--,
          line 60, after "addition," delete "and".

Column 4, line 24, after "solution," delete "or" and insert --and/or--;
          line 25, after "to", delete "and/or".

Signed and Sealed this

Sixth Day of March, 1990

Attest:

JEFFREY M. SAMUELS

*Attesting Officer*     Acting Commissioner of Patents and Trademarks